United States Patent [19]
Alliegro et al.

[11] 3,951,587
[45] Apr. 20, 1976

[54] SILICON CARBIDE DIFFUSION FURNACE COMPONENTS

[75] Inventors: Richard A. Alliegro, Holden; Samuel H. Coes, Northborough, both of Mass.

[73] Assignee: Norton Company, Worcester, Mass.

[22] Filed: Dec. 6, 1974

[21] Appl. No.: 530,083

[52] U.S. Cl............................. 432/253; 432/258; 432/259
[51] Int. Cl.² ......................................... F27B 5/06
[58] Field of Search .......... 432/253, 255, 258, 259, 432/261; 106/44

[56] References Cited
UNITED STATES PATENTS

| | | |
|---|---|---|
| 2,784,112 | 3/1957 | Nicholson .............................. 106/44 |
| 3,183,130 | 5/1965 | Reynolds et al. ................ 432/255 X |
| 3,765,300 | 10/1973 | Taylor .................................. 106/44 |
| 3,811,829 | 5/1974 | Wesson ............................... 432/261 |
| 3,859,399 | 1/1975 | Bailey ................................. 106/44 |

*Primary Examiner*—John J. Camby
*Attorney, Agent, or Firm*—Arthur A. Loiselle, Jr.

[57] ABSTRACT

Process tube, paddle, and boat for a semi-conductor diffusion furnace composed of a matrix of high purity sintered silicon carbide which is made impervious to gases by impregnation thereof with silicon metal which is 99.9% pure. The process tube, paddle and boat provide the ultra pure environment needed for semi-conductor production and are highly resistant to the degradative effect of a great number of high temperature heating cycles.

9 Claims, 6 Drawing Figures

SILICON CARBIDE DIFFUSION FURNACE COMPONENTS

BACKGROUND OF THE INVENTION

The invention relates to heating furnaces and components thereof. More particularly, the invention relates to silicon carbide components for a semi-conductor diffusion furnace.

In the overall manufacturing process for the production of semi-conductor devices such as diodes and transistors, the most critical step is the part of the process referred to as doping. The doping process involves oxidation of thin silicon wafers for electrical insulation, followed by etching of cavities in the surface of the wafers, and the deposition of the dopant i.e. boron, phosphorus, arsenic, or antimony in the cavities which function as the transistor contact points. These semi-conductor components are made separately or in an integrated circuit array. The oxidation step and subsequent doping operation to which the silicon slices are subjected, involve a rapid heat and cool cycle in furnaces at temperatures in the range of from 1000 to 1350°C. This critical heat treatment generally takes place in an electrically heated wire-wound muffle furnace. The silicon slices are placed on quartz or silicon kiln furniture which is then placed within the work tube of the muffle furnace and the silicon slices are fired through a predetermined time-temperature cycle. The diffusing agent is usually introduced in the form of a gas which is fed into the necked-down end of the diffusion furnace work tube. The gas then diffuses into the cavities which had previously been etched into the surface of the slices or wafers. In the oxidation and diffusion steps of the process the silicon slices are placed on boats or plates which are supported on appropriately designed kiln furniture. The kiln furniture and work tube or process tube as it is called, must be made of a material with excellent thermal shock resistance in order to permit rapid heating to, and rapid cooling from, temperatures in the order of 1000° to 1350°C. and back to room temperature. The material of which the kiln furniture and other furnace parts is constructed must also be of high mechanical strength, have the ability to retain its shape through a large number of heating and cooling cycles, and the material must not out gas i.e., introduce any undesirable impurities into the atmosphere of the kiln during firing operations, and the kiln furniture must not introduce any dust like contamination. Cleanliness and control of impurities are extremely important to the achievement of the ultimate desired electrical characteristics in the semi-conductor elements.

These demanding conditions severely limit the number of materials which can successfully be used to fabricate diffusion furnace parts or components. Generally the furnace components consist of a liner, a process tube which fits into the liner and which has a necked-down end for the introduction of the desired atmosphere, a paddle or wheeled carrier upon which are placed wafer supports, and the wafer supports or boats as they are known. These parts have been made of fused silica, however the silica components lose their mechanical strength and progressively devitrify with time at the processing temperatures involved which are generally above 1200°C. In addition, silica components are very susceptible to extreme distortion from the frequent heating and cooling of the material, and will not withstand frequent cleaning with hydrofluoric acid which is normally required to maintain the necessary ultra pure furnace environment. In a more recent modification of the process, the diffusion liner i.e. the tube which surrounds the process tube, has been constructed of dense silicon carbide instead of the prior silica material, and used in conjunction with a silica process tube or inner tube. The silicon carbide possessed high thermal conductivity and high strength as compared to the silica. However, even the silicon carbide liners had their shortcomings. Although the structure of the material in the silicon carbide liner was dense, the liner overall was still not totally impervious to gases. Furthermore, because the structure was porous, the total surface area susceptible to contamination, was very large. As a result the ultra high purity requirements of the furnace environment were never completely attained and therefore the liner had to be used in conjunction with a silica process tube.

It is a principal object of the present invention to provide diffusion furnace components viz. a liner and/or process tube, paddle, and boat, which possess superior oxidation resistance, thermal shock resistance, high strength, the ability to retain their shape through a large number of heating and cooling cycles, an ultra high degree of chemical purity, impermeability to gases, and which have a very low surface area.

SUMMARY OF THE INVENTION

The invention is diffusion furnace parts or components composed of high density sintered silicon carbide which have been made gas impervious by impregnation with silicon metal. The silicon carbide is at least 99% pure silicon carbide and the silicon metal impregnant is also at least 99% pure silicon, but preferably the metal is 99.9% pure.

In a diffusion furnace the process tube or liner or both may be those of the present invention. However, a major advantage of the present invention is that if the process tube is made accordingly, there is no need for the normally used liner tube, i.e. instead of the furnace proper consisting of an inner tube (the process tube) and an outer tube (the liner), only one tube is required. Thus one component of the diffusion furnace system can be completely eliminated. The term "process tube" as used hereinafter, is intended to mean both (1) the tube directly into which the silicon wafers are placed when a second tube, is used outside of the liner, and (2) the tube directly into which the silicon wafers are placed when only one tube is used i.e. without utilizing an outer tube.

DESCRIPTION OF THE PREFERRED EMBODIMENTS

In the preferred practice of the present invention a bimodal silicon carbide powder is utilized. A mixture of 50% by weight of fine silicon carbide powder having a particle size of less than 8 microns (preferably 0.1 to 8 microns), and 50% by weight of silicon carbide powder with an average particle size of from 30 to 170 microns when sintered according to the preferred teaching of the present invention, results in a recrystallized silicon carbide matrix with a bimodal grain structure. The bimodal nature of the sintered structure produces a sintered silicon carbide body with a modulus of rupture of at least 10,000 p.s.i. (700 kg./cm.$^2$) and a degree and character of porosity that allows reasonably easy impregnation of the structure with silicon.

The original silicon carbide powder may be all fine or all coarse or any mixture thereof other than the preferred 50% 0.1 to 8 microns and 50% 30 to 170 micron combination. However, if for example the powder is all of the finer size, then the sintered structure may lack sufficient continuous porosity to permit complete impregnation of the silicon carbide matrix with silicon. The silicon would essentially only impregnate the surface pores or irregularities and form a coating; i.e. only partial impregnation would occur. On the other hand if the silicon carbide powder is substantially coarser, the porosity would be more than adequate in size, as would be the degree of continuity between the pores, but the sintered structure would have lower mechanical strength properties than when the bimodal approach is employed.

Similarly, although it is not essential that the sintering process be such that the silicon carbide matrix retain a bimodal character, it is the more desirable. If the sintering conditions are extreme enough to cause sufficient grain growth so that the sintered structure is not bimodal, it will have adequate mechanical strength but the nature of the porosity may be adversely effected so as to make complete impregnation of the structure with silicon, difficult if not impossible.

In all cases however, the silicon carbide employed must be at least 99% pure so as not to be a source of contamination of the furnace environment during the crucial doping process.

Figure 1:
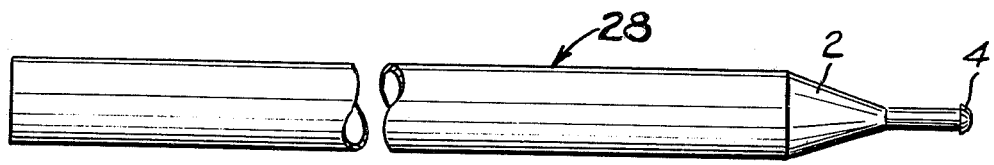
FIG. 1 is an elevated view of a process tube or liner.

The sintered silicon carbide process tube (or liner), paddle, and boat may be preformed by an known technique, the only limitations being those imposed by the complexity of shape of the particular furnace component in point. The process tube (or liner) 1 is a hollow tube with one end necked-down to a substantially smaller diameter. The configuration shown in FIG. 1 is a very preferred design having a necked-down end 2 which terminates in a ball-joint connecting means 4 which readily facilitates a gas tight connection to a source of gas or vacuum. While the process tube could obviously be formed by several ceramic forming techniques, the preferred method is slip casting. Tubes of practically any length and diameter, and any degree of complexity of shape can easily and economically be preformed by slip-casting.

Figure 2:
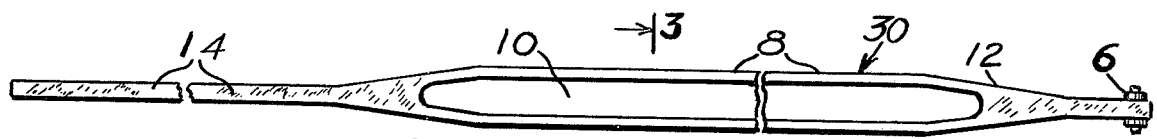
FIG. 2 is a top view of a wheeled paddle.

The paddles or boat carriers 30 FIG. 2 may also be preformed by any known method. For example, the paddle may be made up of a number of individual parts bonded together such as that shown in U.S. Pat. No. 3,705,714 to R. A. Alliegro. In that patent the many parts of the paddle were first completely formed, ultimately by hot-pressing silicon nitride, and the parts assembled with the use of a refractory cement. If a paddle according to the instant invention is desired with the configuration of that shown in the referenced patent, the various parts of the paddle may e.g. first be cold pressed, heat treated to sinter the silicon carbide, impregnated with silicon and then assembled. Alternatively, if a paddle is desired having a configuration such as that shown in FIG. 2 of the present invention, a silicon carbide billet may be formed and machined to shape green or after a presinter heat treatment. The wheels 6 of FIG. 2 would be formed separately and assembled with the main body 8 of the paddle. The machining would also include cutting of depression 10 in which the wafer boats are to be placed. However, again the preferred method of forming is slip casting. Using this method the silicon carbide paddle can be cast to shape and size. Relatively light weight paddles can be made by proper designing. For example, the main body 8 of the paddle of FIG. 2 can be slip cast to the shape shown, having hollow end portions 12 and 14 and a boat carrying section 10 having the cross section shown in FIG. 3. The wheel assembly 6 must be fabricated separately and assembled with the finished paddle.

Figure 4:
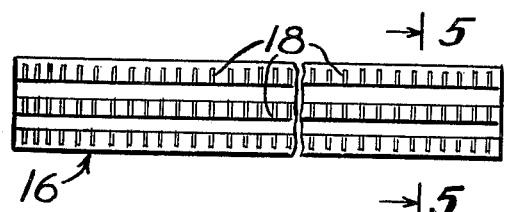
FIG. 4 is a top view of a boat.
Figure 5:
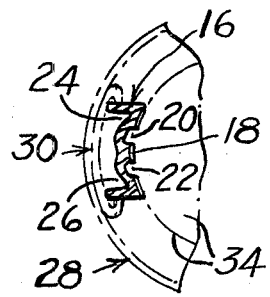
FIG. 5 is a sectional view of the boat of FIG. 4 taken at 5—5.

The boat FIG. 4, or wafer carrier, has the least complex shape of the 3 components. It may be formed by cold-pressing, isostatic pressing, extrusion, or slip casting. However, here as in the process tube and paddle, it is preferable that the boat is as light weight as strength requirements will allow, and that the cross section of the boat be such as to cover a minimum amount of the surface of the silicon wafers which are to fit in the slots in the boat. For these reasons the boat configuration shown by FIGS. 4 and 5 is highly desirable. FIG. 5 shows the overall rectangular shape of the body 16 of the boat, having a multitude of slots 18 into which the silicon wafers are to be placed. FIG. 5 shows a cross sectional view of the boat of FIG. 4. The depressions 20 and 22 in FIG. 5 are channels which traverse the length of the boat and minimize the amount of the silicon wafer which will be covered by the walls of the slots 18. The depressions 24 and 26 are for the purpose of reducing the overall weight of the boat.

Figure 6:
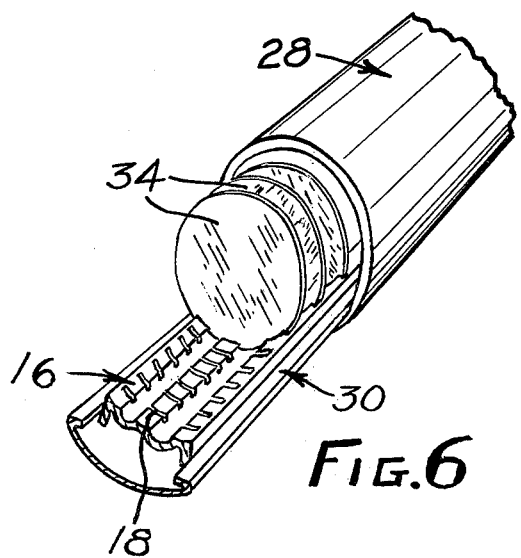
FIG. 6 is a perspective view of the partially assembled furnace including process tube, paddle, and boat with silicon wafers positioned on the latter.

FIG. 6 shows the cooperation between the process tube 28, paddle 30, and boat 16 the latter partially loaded with silicon wafers 34 held in slots 18 in boat 32. The wheeled end (12 in FIG. 2) of the paddle 30 is resting on the bottom of process tube 28. The contoured bottom, FIG. 3, of the paddle permits optimum utilization of the volume of the process tube.

After formation of the green shapes they are then subjected to heat treatment to cause the silicon carbide particles to sinter with varying degrees of recrystallization taking place, depending on the time-temperature conditions employed. The green shapes may be treated as described in U.S. Pat. No. 2,964,823 to John I. Fredriksson. In that method, the slip is allowed to dry in the cast for 10 minutes. It is then removed from the cast and dried at 100°C for a day, after which it is fired at 2250°C for 10 minutes. After the green shapes are so treated, they are then subjected to a second heat treatment to introduce the silicon into the sintered silicon carbide structure, by contacting the sintered parts with silicon at a temperature of about 2150°C in a reducing or at least a non-oxidizing atmosphere, for approximately 10 minutes. This will result in sintered shape becoming partially or wholly impregnated with silicon metal in the amount of from 5 to 30 percent by weight, depending on the degree of density of the sintered shape. The silicon metal must be relatively pure i.e. at least 99% pure and preferably 99.9% pure silicon.

An alternative but equally effective, and sometimes more desirable, method of silicon impregnating the silicon carbide matrix is to eliminate the sintering step described above and to subject the shaped and dried green articles directly to the siliconizing (silicon impregnation) step, also as described above. In this manner, the silicon carbide particles are sintered and the matrix infiltrated, all in one step. Whether this approach is used, or the former, the porous silicon carbide shapes may be treated with the silicon by immersion, by placing the shapes in contact with silicon allowing capillarity and/or gravity to facilitate impregnation, or by exposing the shaped articles to silicon vapor at 2150°C. In any case, at least partial silicon impregnation must occur on at least that surface of the furnace component that is to be exposed to the environment within the furnace. The paddle and boat must be impregnated completely or partially impregnated on all surfaces. The process tube need only be impregnated on or into the inner surface of the tube. Obviously, for optimum performance of these furnace components, it is most desirable to fully impregnate all of the parts.

EXAMPLE

A cooperating set of diffusion furnace components i.e. process tube, paddle and boat, were fabricated as follows:

A casting slip was prepared from the following combination of materials:

| | |
|---|---|
| 0.1–8 micron silicon carbide | 117 lbs. (53.2 kg.) |
| 30–170 micron silicon carbide | 108 lbs. (49 kg.) |
| "N" Brand sodium silicate (Philadelphia Quartz Co.) | 78 cc. |
| tap water | 13.1 liters |

The mixture was tumbled in plastic milling jars with 1 in. (2.54 cm.) diameter rubber balls for 16 hours. A portion of the slip was poured into a plaster of paris mold having a cylindrical cavity measuring approximately 80 inches (203 cm.) in length and 4.5 inches (11.4 cm.) in diameter, with a necked-down end terminating in a cavity corresponding to the outer dimensions of a 25/15 ball joint. The cavity was the shape of the process tube shown in FIG. 1. Additional slip was added periodically until the wall thickness of the casting had reached approximately 0.188 inch (0.47 cm.). The excess slip was poured out and the casting allowed to dry in the mold for about 10 minutes. The casting was then removed from the mold and further dried at room temperature for 24 hours. Approximately 7.5 pounds (3.39 kg.) of high purity silicon were evenly distributed on the bottom of the green tube and in the necked-down portion thereof. A half circle barrier was cemented to the open end of the tube and sheets of graphite felt were taped to the underside. The tube was placed in a furnace and heated to 2150°C in a nitrogen atmosphere, and held at that temperature for a 5 minute soak. The tube was essentially fully impregnated with silicon.

Figure 3:
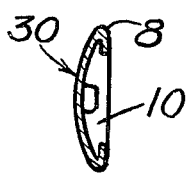
FIG. 3 is a sectional view of FIG. 2 taken through 3—3.

A paddle having the geometry of that shown in FIGS. 2 and 3 was fabricated in essentially the same manner. The paddle measured 54 inches (137 cm.) in length, having depression 10 of FIG. 2 measuring 21 inches (53.4 cm.) in length, 1.75 inches (4.45 cm.) in width, and 0.5 inch (1.27 cm.) deep, and end portions 12 and 14 of FIG. 2 measuring 0.75 × 0.5 inch (1.91 × 1.27 cm.). The wheel and axle were formed the same way but did need minor machining to maximize fit.

Similarly a boat was formed which had the configuration shown in FIGS. 4 and 5 and which measured 20.5 inches (52.1 cm.) in length, 1.6 inches (4.07 cm.) in width, and 0.5 inch (1.27 cm.) in thickness. Slots, numbering 125, were cut in the upper surface of the boat, which will hold the silicon wafers during processing.

It is to be understood that the foregoing is believed to be the best mode of practicing the present invention at the present time. Further, the particular geometric configurations and processing steps are in no way to be construed as limiting the scope of the present invention. An infinite number of shape variations are possible; slip casting is well known in the art, as are various techniques for impregnating porous refractory bodies with metals.

What is claimed is:

1. A system for a semi-conductor diffusion furnace comprising a process tube, a paddle of a size and configuration that will allow the paddle to traverse said process tube, and at least one boat supportable on said paddle, wherein said process tube, paddle and boat consist essentially of a sintered silicon carbide matrix containing 5 to 30% by weight of high purity silicon metal, said silicon metal rendering said tube, paddle and boat gas impervious.

2. The process tube, paddle, and boat of claim 1 wherein the grain size characteristic of said sintered silicon carbide is bimodal, and resulting from the sintering of silicon carbide powder that is made up of approximately 50% by weight of silicon carbide having an average particle size of 0.1 to 8 microns, and 50% by weight of silicon carbide having an average particle size of from 30 to 170 microns, and said silicon metal is at least 99% pure.

3. The process tube, paddle,, and boat of claim 1 wherein said high purity silicon metal fills at least the external porosity of those surfaces of said silicon carbide process tube, paddle and boat that will be subjected to the internal environment of the process tube.

4. The process tube, paddle, and boat of claim 1 wherein said high purity silicon metal substantially impregnates the sintered silicon carbide.

5. In a semi-conductor diffusion furnace, a process tube consisting essentially of a sintered silicon carbide matrix rendered impervious by impregnation of at least the inner surface of said process tube with silicon metal, said silicon metal being present in the range of 5 to 30% by weight and having purity of not less than 99% silicon.

6. In a semi-conductor diffusion furnace, a paddle consisting essentially of a sintered silicon carbide matrix rendered impervious by at least partial impregnation of all surfaces thereof with silicon metal, said silicon metal being present in the range of 5 to 30% by weight and having a purity of at least 99% silicon.

7. In a semi-conductor diffusion furnace, a boat consisting essentially of a sintered silicon carbide matrix rendered impervious by at least partial impregnation of all surfaces thereof with silicon metal, said silicon metal being present in the range of 5 to 30% by weight and having a purity of at least 99% silicon.

8. In a semi-conductor diffusion furnace a gas impervious process tube, boat and paddle, said process tube, boat, and paddle consisting essentially of from 70 to 95% by weight of a sintered recrystallized silicon carbide matrix which is 99 to 100% pure silicon carbide, impregnated with 5 to 30% by weight of silicon metal which is at least 99.9% pure silicon, the composite of silicon carbide and silicon having a modulus of rupture at room temperature of at least 10,000 p.s.i. (700 kg./cm.$^2$).

9. A system for a semi-conductor diffusion furnace comprising a process tube, a mating paddle, and at least one boat supportable on said paddle, wherein said process tube, paddle and boat consist essentially of a sintered silicon carbide matrix impregnated with 5 to 30% by weight of silicon metal which is at least 99.9% pure, said silicon metal impregnant rendering said process tube, paddle, and boat gas impervious, and wherein said process tube has a cone shaped end terminating in a ball joint suitable for attachment to an apparatus for introduction of gas into said process tube.

* * * * *